United States Patent
Oda et al.

(10) Patent No.: US 6,633,082 B1
(45) Date of Patent: Oct. 14, 2003

(54) SEMICONDUCTOR DEVICE AND METHOD FOR MANUFACTURING THE SEMICONDUCTOR DEVICE

(75) Inventors: Noriaki Oda, Tokyo (JP); Akira Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/088,048

(22) Filed: Jun. 1, 1998

(30) Foreign Application Priority Data

May 30, 1997 (JP) .............................. 9-142447

(51) Int. Cl.$^7$ .............................................. H01L 29/68
(52) U.S. Cl. ...................... 257/750; 257/751; 257/758; 257/759; 257/760; 257/914
(58) Field of Search ................ 257/760, 758, 257/759, 750, 914, 751

(56) References Cited

U.S. PATENT DOCUMENTS

| | | | | | |
|---|---|---|---|---|---|
| 5,518,962 A | * | 5/1996 | Murao | .......................... | 437/195 |
| 5,532,516 A | * | 7/1996 | Pasch et al. | ................. | 257/752 |
| 5,616,959 A | * | 4/1997 | Jeng | ............................ | 257/758 |
| 5,716,890 A | * | 2/1998 | Yao | ............................ | 483/624 |
| 5,883,433 A | * | 3/1999 | Oda | ............................ | 257/750 |
| 5,990,001 A | * | 11/1999 | Oda | ............................ | 438/633 |
| 5,990,555 A | * | 11/1999 | Ohori et al. | ................. | 257/750 |

FOREIGN PATENT DOCUMENTS

| | | |
|---|---|---|
| JP | 3-209828 | 9/1991 |
| JP | 5-6939 | 1/1993 |
| JP | 5-259297 | 10/1993 |
| JP | 6-349950 | 12/1994 |
| JP | 8-46038 | 2/1996 |
| JP | 8-107149 | 4/1996 |
| JP | 8-139194 | 5/1996 |
| JP | 8-167650 | 6/1996 |
| JP | 9-36116 | 2/1997 |
| JP | H9-64034 | 3/1997 |

OTHER PUBLICATIONS

K. Mikagi et al., "Barrier Metal Free Copper Damascene Interconnection Technology Using Atmospheric Copper Reflow and Nitrogen Doping in SiOF Film", *IEDM Technical Digest*, Dec., 1996, pp. 1–4.

Thomas Zoes et al., "Planarization Performance of Flowable Oxide In The Sub–0.5 μm Regime", *Conference Proceedings, ULSI XI*. 1996 Materials Research Society, pp. 121–125.

* cited by examiner

*Primary Examiner*—Long Pham
*Assistant Examiner*—Shrinivas H. Rao
(74) *Attorney, Agent, or Firm*—Sughrue Mion, PLLC

(57) ABSTRACT

A semiconductor device is provided and contains a substrate, a first wiring layer, a first oxide film, a dielectric film, a first nitrogen layer, a second wiring layer, a via hole, and a second nitrogen layer. The first wiring layer is formed on the substrate, and the first oxide film formed on the first wiring layer. The dielectric film has a low dielectric constant and is disposed between the first and second wiring layers. The first nitrogen layer contains nitrogen and is formed in the first oxide film. The via hole is formed through the dielectric film and is disposed between the first wiring layer and the second wiring layer for electrically connecting the first wiring layer and the second wiring layer. The second nitrogen layer contains nitrogen and is formed on a side wall of the via hole. Since the first and second nitrogen layers prevent moisture from spreading to various portions of the semiconductor device, leak current between adjacent wirings of the wiring layers is prevented. Also, the chances that an opening will not form in the via hole when the via hole is created is reduced.

14 Claims, 12 Drawing Sheets

RESISTANCE IN VIA HOLE, RATIO OF FAILURE OF OPENING, DEPENDENCE OF LIFE TO ELECTROMIGRATION UPON VIA HOLE SIZE

*NOTE 1: $T_{50}$ IS MEASURED UNDER CONDITIONS OF CURRENT DENSITY OF ZE6A/cm² AND TEMPERATURE OF 200°C WHEN RESISTANCE INCREASES 10%

PRIOR ART

PRIOR ART

SEMICONDUCTOR DEVICE AND METHOD FOR MANUFACTURING THE SEMICONDUCTOR DEVICE

FIELD OF THE INVENTION

The present invention relates to a semiconductor device and method for manufacturing the semiconductor device. More particularly, the invention relates to a semiconductor device which has a multilayer wiring structure and uses a film having a low dielectric constant as an interlayer insulating film and relates to a method for manufacturing the semiconductor device.

BACKGROUND OF THE INVENTION

As the density of the large scale integration of semiconductor devices has increased, the density of the multilayer wiring structure of the semiconductor devices has also increased. With the increased density of the wiring structure, the wirings adjacent to each other on the same layer and the wirings adjacent to each other on different layers still must be well insulated by an interlayer insulating film.

FIG. 10 shows a sectional view of a semiconductor device having a multilayer wiring structure. Such device is described in Japanese published unexamined patent application No. H8-107149. As shown in the figure, the device contains a semiconductor substrate 101 and an element separating area 102 provided on the semiconductor substrate 101. A diffusion layer area 103 is formed in the semiconductor substrate 101 in an area of the substrate 101 that is partitioned by the element separating area 102.

A metal oxide semiconductor ("MOS") transistor is formed on the diffusion layer area 103 of the semiconductor substrate 101 and contains source and drain areas 121, a gate oxide film 122, a gate electrode 123, and side wall oxide films 124. A first interlayer insulating film 104 is provided over the element separating area 102 and the diffusion layer area 103, and contact openings 105 are selectively formed in the first interlayer insulating film 104. The inner walls of the contact openings 105 are lined with a barrier metal 106, and the contact openings 105 are filled with tungsten 107 which extends to the upper surface of the first interlayer insulating film 104.

Then, a first wiring layer 108 containing mainly aluminum is formed on the first interlayer insulating film 104 at least in an area above the contact openings 105. A first oxide film 109 is formed over the first wiring layer 108 by a plasma chemical vapor deposition ("CVD") process such that the upper and side surfaces of the first wiring layer 108 are covered. Also, the portion of the first oxide film 109 on the side surface of the first wiring layer 108 is thinner than the portion of the first oxide film 109 on the upper surface of the first wiring layer 108. For example, if the portion of the first oxide film 109 on the upper surface has a thickness of 100 nm, the portion of the film 109 on the side surface has a thickness of approximately 50 nm.

Also, a hydrogen silsesquioxane ("HSQ") layer 110 is used as a film having a low dielectric constant and is formed over the first oxide film 109, and a second oxide film 111 is formed on the upper surface of the HSQ layer 110. Then, the upper surface of the second oxide film 111 is flattened. Since the portion of the first oxide film 109 on the side surface of the first wiring layer 108 is thin in comparison to the portion of the film 109 on the upper surface, the space in which the HSQ layer 110 (i.e. the film with the low dielectric constant) is provided between the wirings of the first wiring layer 108 is increased. Therefore, the spacing between adjacent wirings can be reduced. Also, instead of using the HSQ layer 110 as the film with a low dielectric constant, a layer of parylene, benzocyclobutene ("BCB"), or other material may be used.

A via hole 112 is selectively formed in the first oxide film 109, the HSQ layer 110, and the second oxide film 111, and the inner wall of the via hole 112 is lined with a barrier metal 113 which extends to the upper surface of the second oxide film 111. Then, the via hole 112 is filled with tungsten 114. A second wiring layer 115 containing an aluminum alloy is formed on the second oxide film 111 at least in an area above the via hole 112. A cover film 116 consisting of plasma SiON which is 1 $\mu$m thick is formed on the second wiring layer 115.

The method in which the semiconductor device shown in FIG. 10 is manufactured will be described below in conjunction with FIGS. 11A, 11B, and 12. As shown in FIG. 11A, the element separating area 102 is formed on the semiconductor substrate 101 by a LOCOS method and other methods, and the diffusion layer area 103 is formed via ion implantation in an area of the semiconductor substrate 101 defined by the element separating area 102. The source and drain areas 121 are formed in the diffusion layer area 103, and the gate oxide film 122, the gate electrode 123, and the side wall oxide films 124 of the MOS transistor are formed on the diffusion layer area 103.

The first interlayer insulating film 104 is formed over the element separating area 102, the diffusion layer area 103, and the MOS transistor. Also, the first interlayer insulating film 104 contains an oxide film layer which is approximately 100 nm thick and a boron phospho silicate glass ("BPSG") layer which is approximately 700 nm thick and which is formed on the oxide film layer. The contact openings 105 are selectively formed over the source and drain areas 121 of the MOS transistor, and the barrier metal 106 is formed on the inner surface of the contact openings 105. Then, the contact openings 105 are filled with tungsten 107 via a CVD process, and the first wiring layer 108 containing an aluminum alloy is formed over at least the contact openings 105 via a patterning process. The first wiring layer 108 has a thickness of 0.4 $\mu$m, and the distance between adjacent wirings of the first wiring layer 108 is approximately 0.3 $\mu$m.

As shown in FIG. 11B, the first oxide film 109 is formed over the first interlayer insulating film 104 and the first wiring layer 108 via a plasma CVD process such that it is approximately 50 nm thick on the upper surface of the first wiring layer 108. The HSQ layer 110 is formed by a spin coating method so that it is approximately 400 nm thick in the flat part. In other words, the thickness of the portion of the HSQ layer 110 which is not directly over the wiring layer 108 is approximately 400 nm. Afterwards, the HSQ layer 110 is baked at a temperature of approximately 350° C. Then, a heat treatment is applied to the layer 110 at approximately 400° C. to eliminate an organic component such as isomethylbutyl ketone which functions as a solvent.

Then, as shown in FIG. 12, the second oxide film 111 is formed over the HSQ layer 110 and is approximately 2 $\mu$m thick. Afterwards, the second oxide film 111 is flattened by a chemical mechanical polishing ("CMP") process and other processes. The via hole 112 is selectively made through the is first oxide film 109, the HSQ layer 110, and the second oxide film 111, and the barrier metal 113 containing titanium nitride is formed on the inner surface of the via hole 112. Then, the via hole 112 is filled with tungsten 114 formed by a blanket CVD process, and an etchback process is performed. Afterwards, the second wiring layer 115 containing an aluminum alloy is formed via a patterning process and has a thickness of 0.4 µm. Then, the semiconductor device is completed by forming the cover film 116 containing plasma SiON on the second wiring layer 115 at a thickness of approximately 1 µm.

In the semiconductor device described above, the first oxide film 109 formed on the side wall of the first wiring layer 108 is thinned in order to enhance the effect achieved by the HSQ layer 110 having a low dielectric constant. However, since the first oxide film 109 is thinned, moisture in the HSQ layer 110 can penetrate the first oxide layer 109. As a result, the moisture increases the current which leaks between the adjacent wirings of the first wiring layer 108. Also, the moisture creates voids in the wiring layer 108 and decreases the ability of the wirings to withstand electromigration. When electromigration occurs in the wirings of the first wiring layer 108, aluminum atoms in the wirings migrate due to electron flow, and voids are formed in the wirings. As a result, the resistance of the wirings is increased and the speed of the circuit is decreased. The above problems are further exaggerated if the miniaturization of a semiconductor device is increased and the distance between adjacent wirings is reduced. The exaggeration of such problems occurs because the space between the adjacent wirings is reduced. Specifically, in such case, the oxide film 109 on the side wall of the wirings must be further thinned to increase the amount of the HSQ layer 110 that can be disposed between the wirings.

Also, in general, when the via hole 112 is selectively formed, a photoresist (not shown) is used as a mask and is peeled away. Then, an ashing process using an $O_2$ plasma and a wetting process are executed. However, when the wetting process is executed, moisture is absorbed in the portion of the HSQ layer 110 that is exposed to the side wall of the via hole 112. As the absorbed moisture seeps into the via hole 112 when the barrier metal 113 is formed by a sputtering process or during a thermal process after the barrier metal 113 is formed, a cavity is formed in the via hole 112. As a result, the size (i.e. circumference) of the via hole 112 is reduced, and an opening in the via hole 112 may fail to occur. Since the size of the via hole 112 is reduced, its resistance is increased. The chances of the opening not occurring are dramatically increased as the diameter of the via hole 112 is reduced in an attempt to reduce the size of the semiconductor device. The reason that the chances increase is because the ratio of the side area of the HSQ layer 110 containing the moisture to the volume of the via hole 112 increases as the diameter of the via hole 112 is reduced. Furthermore, since the HSQ layer 110 connects a path between adjacent via holes 112, the leak current between the adjacent via holes 112 increases.

In order to attempt to overcome the above problems, the side wall of a via hole can be covered with an inorganic material such as an oxide film as described in Japanese published unexamined patent applications No. H3-209828 and No. H8-139194. However, in the above technique, an insulating film such as an oxide film is deposited in the via hole after the via hole is made, and thus, the effective diameter of the completed via hole is smaller than the initially intended diameter of the via hole. As a result, the resistance in the via hole is increased. Also, the diameter of the via hole cannot be controlled, and thus, resistance in the via hole is not fixed. In order to reduce the resistance in a via hole and remove a natural oxide film on the layer wiring exposed at the bottom of the via hole, a plasma processing method has been proposed in Japanese published unexamined patent application No. H8-046038. However, when a diffusion type plasma source is used to reduce damage caused by ion irradiation during the plasma processing method, the cost of manufacturing the semiconductor device is substantially increased.

SUMMARY OF THE INVENTION

An object of the present invention is to prevent leak current between adjacent wirings from increasing when the distance between the wirings is reduced.

Another object of the present invention is to provide a semiconductor device and a method for manufacturing the semiconductor device in which the deterioration of the reliability of the wiring is prevented.

A further object of the present invention is provide a semiconductor device and a method for manufacturing the semiconductor device in which the increase of resistance in a via hole is prevented, the chance that an opening in the via hole will not be created is reduced, the deterioration of the resistance of the via hole to electromigration is prevented, and the leak current via the via hole is prevented.

In order to achieve the above and other objects, a semiconductor device is provided. The device comprises: a substrate; a first wiring layer; a first oxide film formed on said first wiring layer; a dielectric film having a low dielectric constant formed on said first oxide film; a first nitrogen layer containing nitrogen formed in said first oxide film; a second wiring layer, wherein said dielectric film is disposed between said second wiring layer and said first wiring layer; a via hole formed through said dielectric film and disposed between said first wiring layer and said second wiring layer for electrically connecting said first wiring layer and said second wiring layer; a second nitrogen layer containing nitrogen formed on a side wall of said via hole.

In order to further achieve the above and other objects, a method for manufacturing a semiconductor device is provided. The method comprises the steps of: (a) forming a first wiring layer according to a predetermined pattern at least indirectly on a substrate; (b) forming a first oxide film above said first wiring layer; (c) forming a first nitrogen layer in said first oxide film by supplying said first oxide film with nitrogen; (d) forming a dielectric film with a low dielectric constant above said first oxide film; (e) forming a second wiring layer, wherein said dielectric film is disposed between said first wiring layer and said second wiring layer; (f) forming a via hole through said dielectric film to connect said first wiring layer and said second wiring layer; and (g) forming a second nitrogen layer in a side wall of said via hole by supplying said side wall with nitrogen.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

The following description of the preferred embodiments discloses specific configurations, values, and processes. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, values, and processes of the present invention which would have been known to one skilled in the art are omitted for the sake of clarity and brevity.

Figure 1:
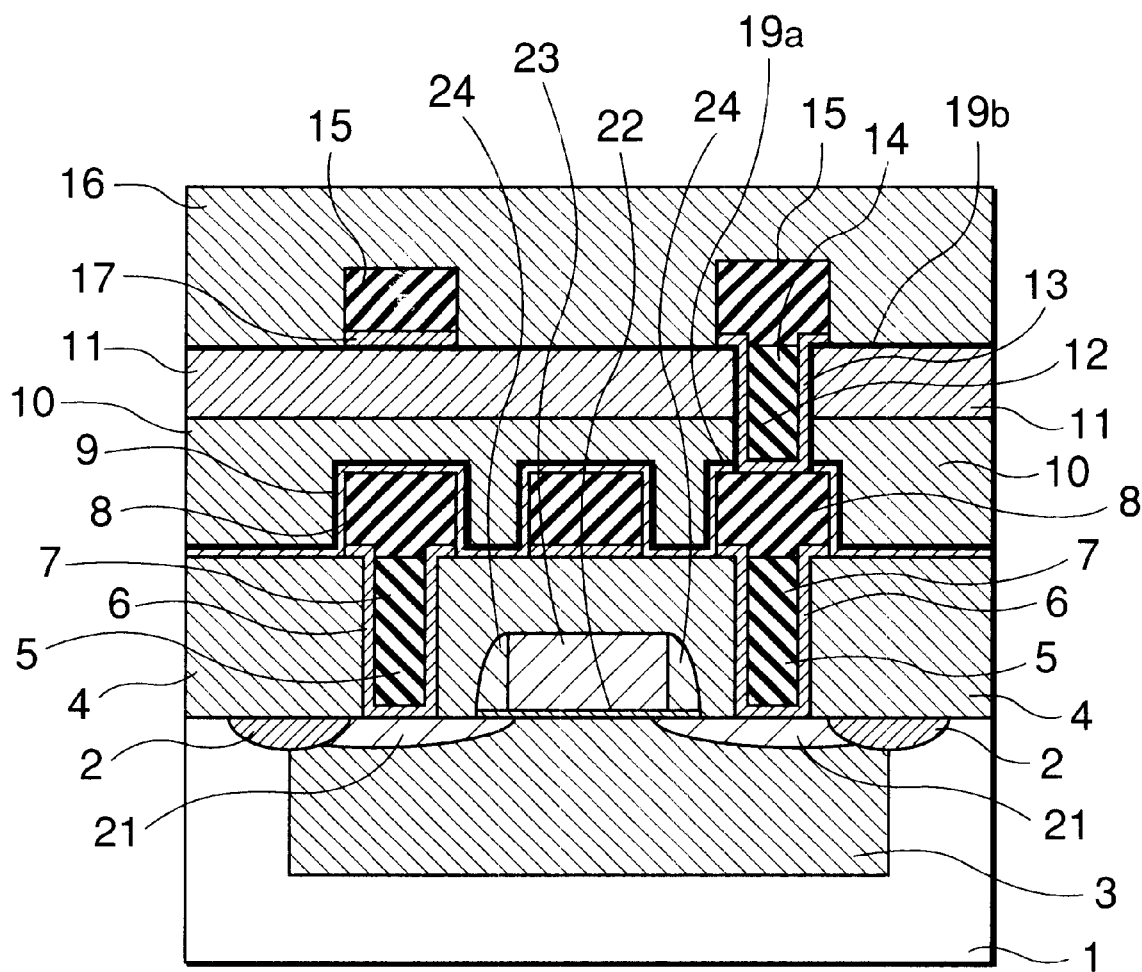
FIG. 1 is a sectional view of a first embodiment of a semiconductor device according to the present invention.

FIG. 1 is a sectional view of a semiconductor device in accordance with a first embodiment of the present invention. As shown in the figure, the device contains a semiconductor substrate 1 and an element separating area 2 provided on the semiconductor substrate 1. A diffusion layer area 3 is formed in the semiconductor substrate 1 in an area of the substrate 1 that is partitioned by the element separating area 2. Many different types of devices may be formed on or over the diffusion layer area 3 of the semiconductor substrate 1. However, in the illustrative, non-limiting embodiment, a MOS transistor is formed on diffusion layer area 3. The MOS transistor comprises source and drain areas 21, a gate oxide film 22, a gate electrode 23, and side wall oxide films 24.

A first interlayer insulating film 4, which is approximately 800 nm thick, is provided over the element separating area 2 and the diffusion layer area 3, and at least one contact opening 5 is selectively formed in the first interlayer insulating film 4. The inner wall of the contact opening 5 is lined with a barrier metal 6, and the contact opening 5 is filled with tungsten 7 which extends to the upper surface of the first interlayer insulating film 4. The barrier metal 6 may comprise a layer of titanium which is approximately 30 nm thick and a layer of titanium nitride which is approximately 100 nm thick and which is disposed on top of the layer of titanium.

Then, a first wiring layer 8 containing mainly aluminum is formed in accordance with a predetermined pattern on the first interlayer insulating film 4 at least in an area above the contact opening 5. The interval between adjacent wirings of the first wiring layer 8 is approximately 0.3 µm. A first oxide film 9 is formed over the first wiring layer 8 by a plasma CVD process such that the upper and side surfaces of the first wiring layer 8 are covered. During the CVD process, the film 9 is created by forming $SiO_2$ via an anisotropic process, and thus, the portion of the first oxide film 9 on the side surfaces of the first wiring layer 8 is thinner than the portion of the first oxide film 9 on the upper surfaces of the first wiring layer 8. For example, if the portion of the first oxide film 9 on the upper surfaces has a thickness of about 50 nm, the portion of the film 9 on the side surfaces has a thickness of approximately 25 nm.

An area 19a is formed in the first oxide film 9 by doping the first oxide film 9 with nitrogen from the surface of the film 9 to a depth of approximately 20 nm. Also, the density of the nitrogen in the area 19a is approximately $2 \times 10^{21}/cm^3$. When the film 9 (i.e. the $SiO_2$ film) is doped with nitrogen, a silicon nitride oxide ("SiON") film is formed.

An HSQ layer 10 is used as a film having a low dielectric constant and is formed over the first oxide film 9. In the present embodiment, the dielectric constant of the HSQ layer 10 is approximately 3.0, but could be any value which is less than or equal to 3.5. Also, instead of using the HSQ layer 10 as the film having a low dielectric constant, a material such as parylene, polymer spin-on-glass ("SOG"), Teflon, polyimide, or amorphous carbon may be used as such film. A second oxide film 11, which is approximately 500 nm thick, is formed on the upper surface of the HSQ layer 10, and the upper surface of the second oxide film 11 is flattened.

A via hole 12 is selectively formed in the first oxide film 9, the HSQ layer 10, and the second oxide film 11. Then, an area 19b containing nitrogen is formed in the inner wall of the via hole 12 (i.e. in the inner walls of the first oxide film 9, the HSQ layer 10, and the second oxide film 11). The density of the nitrogen in the area 19b is approximately $1 \times 10^{21}/cm^3$ or more between the surface of the area 19b and a depth of approximately 15 nm below the surface. The bottom surface and the inner wall of the via hole 12 are lined with a barrier metal 13 which extends to the upper surface of the second oxide film 11. The barrier metal 13 may comprise titanium nitride and may be approximately 100 nm thick. Then, the via hole 12 is filled with tungsten 14. A second wiring layer 15 containing an aluminum alloy is formed in accordance with a predetermined pattern on the second oxide film 11 at least in an area above the via hole 12. Then, a cover film 16 comprising plasma SiON is formed on the second wiring layer 115 at a thickness of approximately 1 µm.

As shown above, the semiconductor device has a two-layer wiring structure. However, a semiconductor device having more than a two-layer wiring structure may also be formed in accordance with the present invention.

Figure 2A:
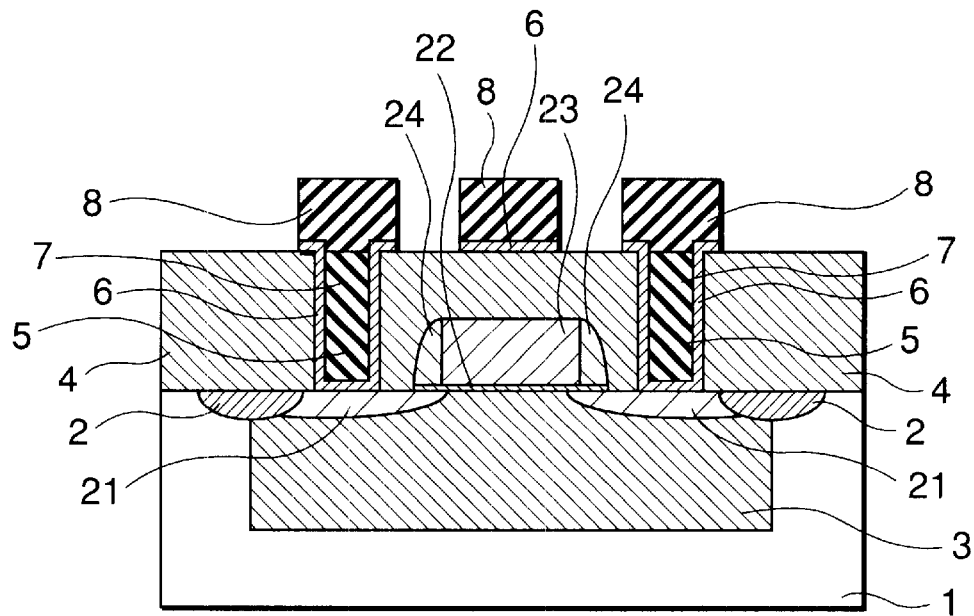
FIGS. 2A and 2B are sectional views of a first set of steps for manufacturing the semiconductor device shown in FIG. 1.

The method by which the semiconductor device shown in FIG. 1 is manufactured will be described below in conjunction with FIGS. 2A, 2B, 3A, 3B, 4A, and 4B. As shown in FIG. 2A, the element separating area 2 is formed on the semiconductor substrate 1 by a LOCOS method and/or other methods, and the diffusion layer area 3 is formed in an area of the semiconductor substrate 1 defined by the element separating area 2 via ion implantation using a photoresist (not shown). Then, the gate oxide film 22, the gate electrode 23, and the side wall oxide films 24 are formed, and the source and drain areas 21 are formed in the diffusion layer area 3 via ion implantation.

The first interlayer insulating film 4 is formed over the element separating area 2, the diffusion layer area 3, and the MOS transistor. Also, the first interlayer insulating film 4 contains an oxide film layer which is approximately 100 nm thick and a BPSG layer which is approximately 700 nm thick and which is formed on the oxide film layer. The contact openings 5 are selectively formed over the source and drain areas 21 of the MOS transistor, and the barrier metal 6 is formed by depositing metal on the inner surface of the contact opening 5. Then, the contact opening 5 is filled with tungsten 7 via a CVD process.

An aluminum alloy having a thickness of 0.4 μm is deposited on the first interlayer insulating film 4, and the alloy film and barrier metal 6 are etched to form the first wiring layer 8 over at least the contact opening 5. The first wiring layer 8 has a thickness of 0.4 μm, and the distance between adjacent wirings of the first wiring layer 8 is approximately 0.3 μm.

Figure 2B:
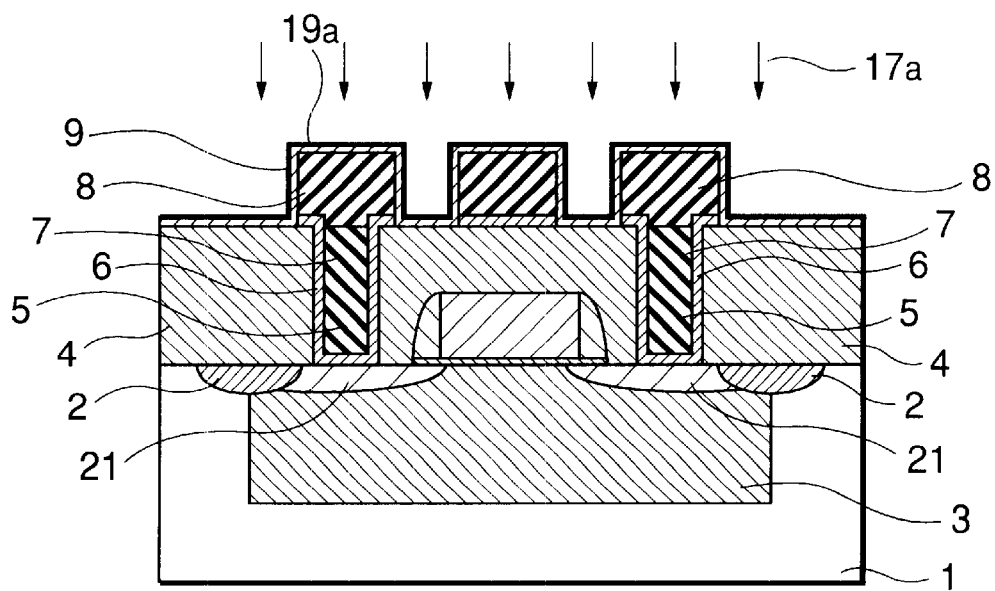

Then, as shown in FIG. 2B, the first oxide film 9 is formed over the first interlayer insulating film 4 and the first wiring layer 8 via the plasma CVD process such that it is approximately 50 nm thick on the upper surface of the first wiring layer 8 and 25 nm thick on the side surfaces. Then, the first wiring layer 8 is doped with $NH_3$ plasma 17a from the surface of the layer 8 to a depth of approximately 20 nm to form the area 19a containing nitrogen. Instead of the specific depth of 20 nm, the layer 8 may be doped from the surface to a depth of 10 nm to 20 nm. Also, the density of the nitrogen in the area 19a is about $2 \times 10^{21}/cm^3$. However, the density could be any value which is greater than or equal to $1 \times 10^{21}/cm^3$. In the illustrative, non-limiting, embodiment, the flow rate of $NH_3$ during the plasma treatment is 500 to 1000 sccm, the air pressure is 200 to 300 Torr, the temperature is 300° C., and the power (i.e. radio frequency power or electric power) is 500 to 1000 W.

Figure 3A:
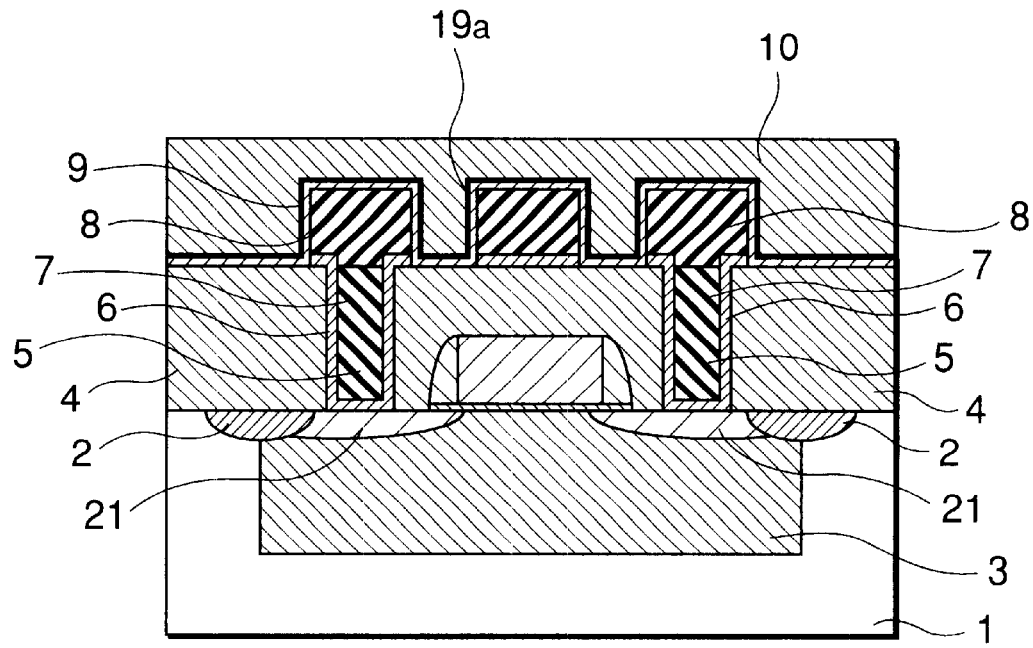
FIGS. 3A and 3B are sectional views of a second set of steps for manufacturing the semiconductor device shown in FIG. 1.

As shown in FIG. 3A, the HSQ layer 10 is formed on the area 19a by a spin coating method so that it is approximately 400 nm thick in the flat part. Afterwards, the HSQ layer 10 is baked at a temperature of approximately 350° C. Then, a heat treatment is applied to the layer 10 at approximately 400° C. to eliminate an organic component such as isomethylbutyl ketone which functions as a solvent.

Figure 3B:
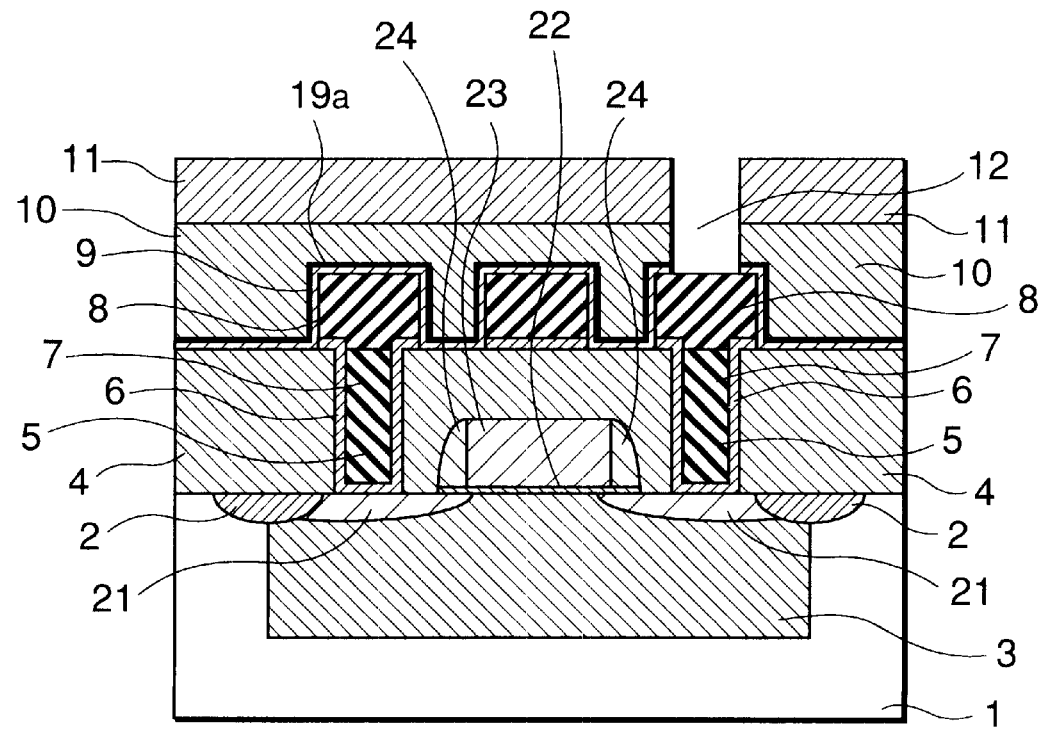

Then, as shown in FIG. 3B, the second oxide film 11 is formed over the HSQ layer 10 and is approximately 2 μm thick. Afterwards, the second oxide film 11 is flattened by a CMP process and/or other processes. The via hole 12 is selectively made through the first oxide film 9, the HSQ layer 10, and the second oxide film 11 and may be made by a photolithographic process followed by a reactive ion etching process. The photoresist (not shown) used to make the via hole 12 is peeled away by an ashing process using oxygen plasma and a wetting process using a mixed solution of $H_2SO_4$ and $H_2O_2$.

Figure 4A:
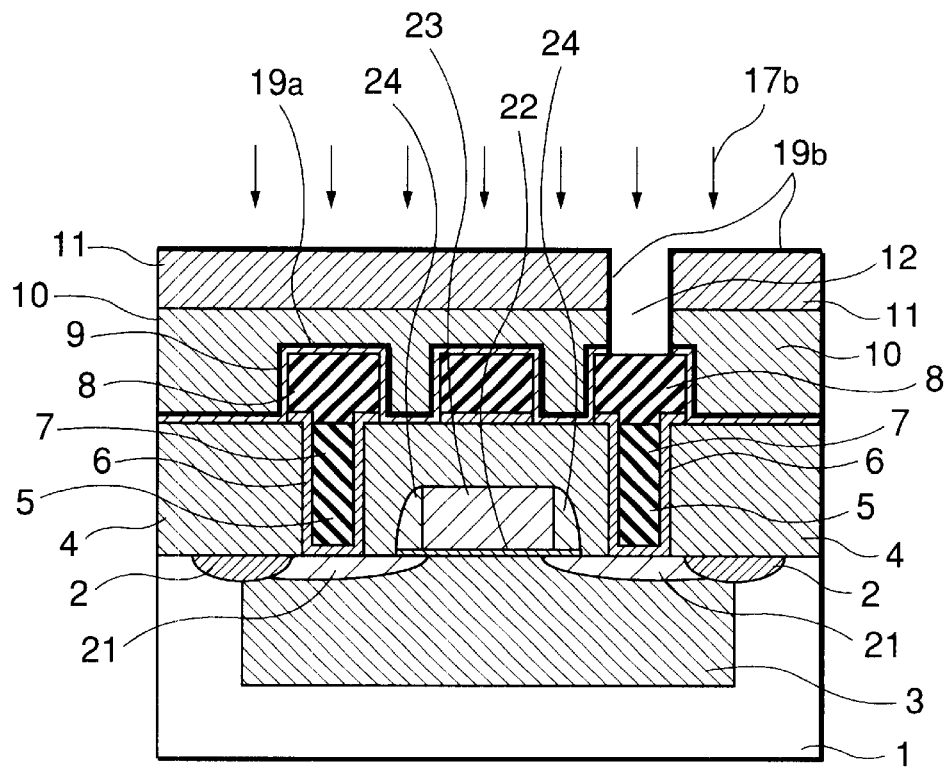
FIGS. 4A and 4B are sectional views of a third set of steps for manufacturing the semiconductor device shown in FIG. 1.

Then, as shown in FIG. 4A, the area 19b is formed by doping nitrogen in the second oxide film 11 and in the inner wall of the via hole 12 which is formed by the side surfaces of the second oxide film 11 and the HSQ 10 layer. The area 19b may be formed via a plasma treatment process using $NH_3$ plasma 17b in which the flow rate of $NH_3$ is 500 to 1000 sccm, the air pressure is 200 to 300 Torr, the temperature is approximately 300° C., and the power is 500 to 1000 W. The time during which the process is performed is approximately 30 minutes. The density of the nitrogen in the area 19b is preferably greater than or equal to $1 \times 10^{21}/cm^3$. Also, the area may be formed by doping the inner wall of the via hole 12 from the surface to a depth of 10 nm to 20 nm.

Figure 4B:
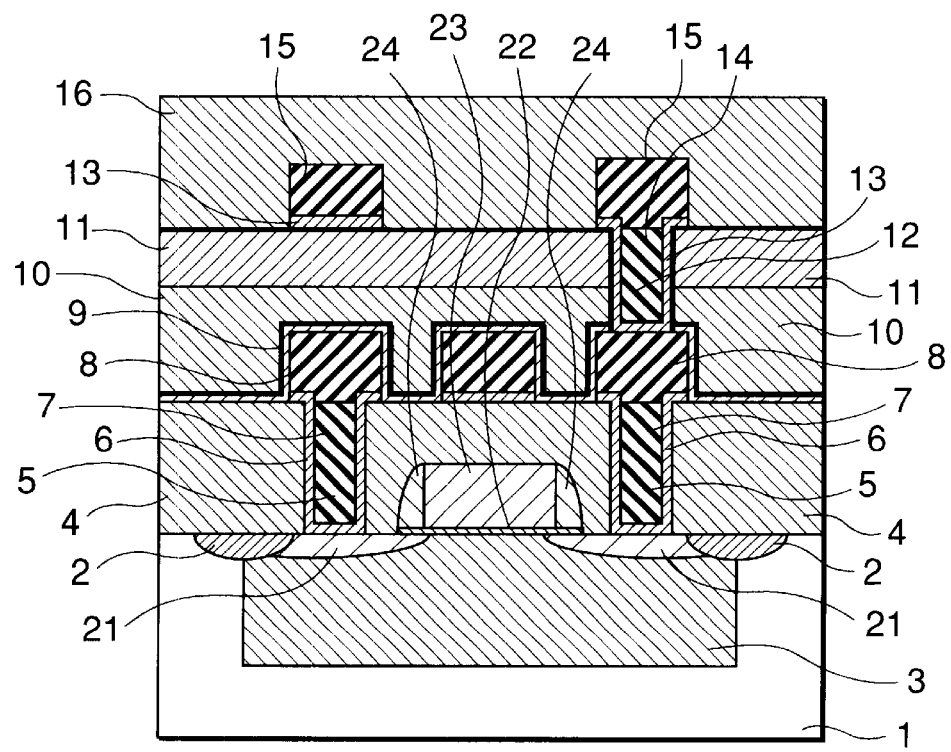

As shown in FIG. 4B, the barrier metal 13 containing titanium nitride is formed on the second oxide film 11 and on the inner surface of the via hole 12. Then, the via hole 12 is filled with tungsten 14 via a blanket CVD process, and an etchback process is performed. Afterwards, an aluminum alloy having a thickness of approximately 0.4 μm is formed over the area 19b and the tungsten 14 in the via hole 12, and the second wiring layer 15 is formed by patterning the aluminum alloy. Then, the semiconductor device is completed by forming the cover film 16 containing plasma SiON on the second wiring layer 15 at a thickness of approximately 1 μm.

The plasma source used for the plasma treatment of $NH_3$ mentioned above may be a normal parallel plate type. However, a diffusion type plasma source such as an electron cyclotron resonance (ECR) source or a helicon wave may be also used.

In the semiconductor device shown in FIG. 1, the area 19a containing nitrogen is created in the first oxide film 9 located between the first wiring layer 8 and the HSQ layer 10. As a result, moisture can be prevented from being diffused from the HSQ layer 10 to the first wiring layer 8 even if the HSQ layer 10 absorbs moisture. Therefore, the reliability of wirings in the first wiring layer 8 is greatly improved, and the leak current between wirings can be reduced.

Figure 5:
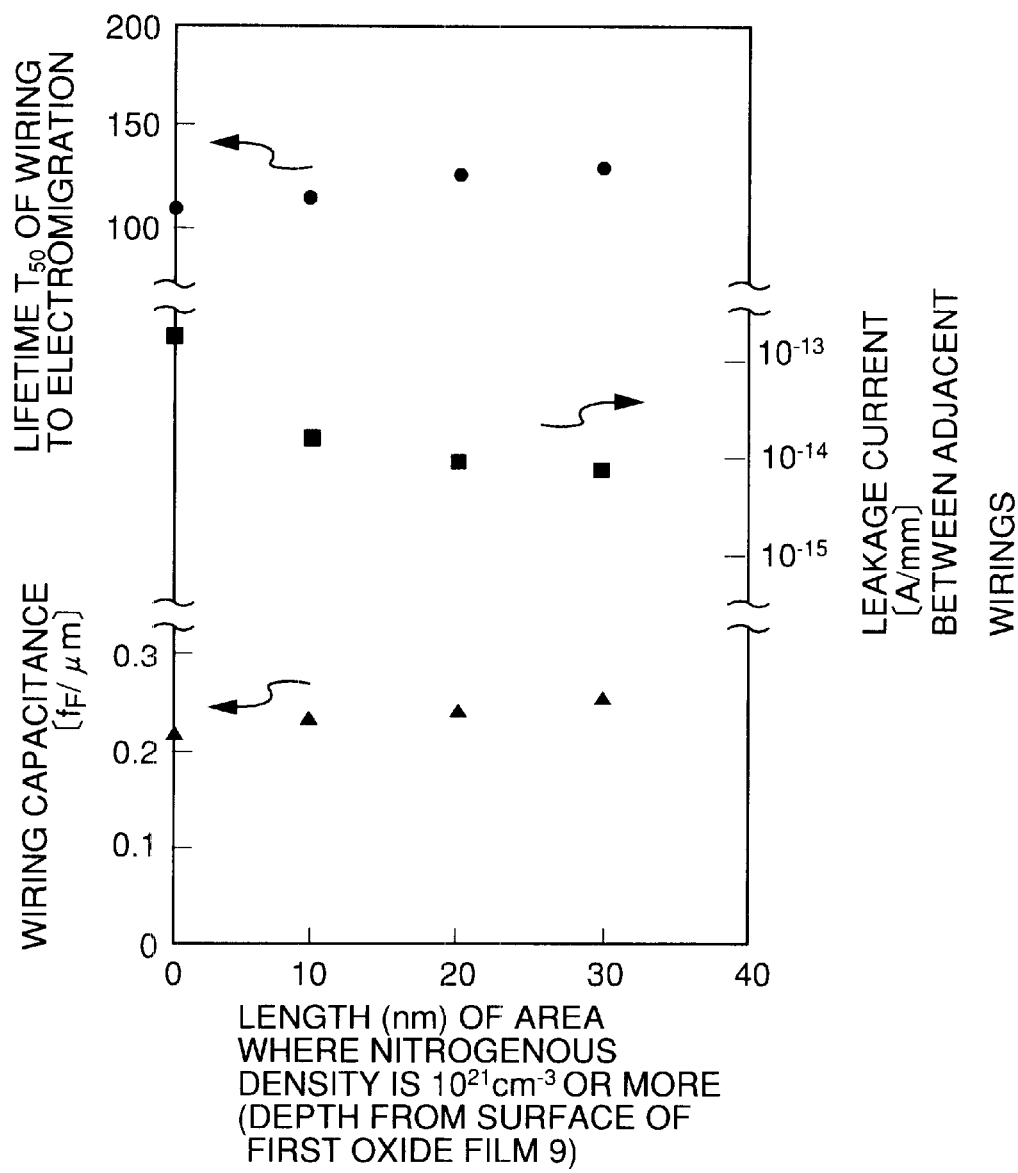
FIG. 5 is a graph analyzing the lifetime of the wiring due to electromigration, the leak current between adjacent wirings, and the capacitance between adjacent wirings of the semiconductor shown in FIG. 1.

FIG. 5 is a graph illustrating various advantages of the semiconductor device of the first embodiment. The graph shows the lifetime $T_{50}$ of the wiring to electromigration versus the depth from the surface of the first oxide film 9 at which the nitrogen density is greater than or equal to $1 \times 10^{21}/cm^3$. The lifetime $T_{50}$ of the wiring to electromigration refers to the time at which the resistance of the wirings (or via holes) increases by 10% due to the effects of electromigration. Specifically, the resistance of each of the wirings is monitored, and the lifetime $T_{50}$ of the wiring to electromigration is defined as the time at which the resistance of one half of the wirings increases by 10% or more. The graph also shows the amount of leakage current between adjacent wirings of the first wiring layer 8 versus the depth from the surface of the first oxide film 9 at which the nitrogen density is greater than or equal to $1 \times 10^{21}/cm^3$. Also, the graph shows the wiring capacitance of the wirings in the first wiring layer 8 versus the depth from the surface of the first oxide film 9 at which the nitrogen density is greater than or equal to $1 \times 10^{21}/cm^3$.

Also, the data used to create the graph was obtained under the following conditions. The distance between the wirings of the first wiring layer 8 was 0.3 μm, and the wirings were formed of an upper layer of TiN having a thickness of 50 nm, a middle layer of AlCu having a thickness of 400 nm, and a lower layer of TiN having a thickness of 100 nm. Also, the thickness of the first oxide film 9 on the side surfaces of the wirings of the first wiring layer 8 was 25 nm. Finally, the lifetime of the wirings to electromigration (i.e. the time $T_{50}$ at which the resistance of 50% of the wirings increased by 10%) was measured while the current density in the wirings equaled $2 \times 10^6$ A/cm$^2$ and the temperature was 200°C.

As shown in FIG. 5, the longer that the first oxide film 9 is subjected to the plasma treatment of $NH_3$ (i.e. the greater distance from the surface of the film 9 that the nitrogen is doped), the longer the lifetime $T_{50}$ of the wiring to electromigration becomes. Also, as the time during which the film 9 is subjected to the plasma treatment increases, the leak current between adjacent wirings decreases, and the capacitance between adjacent wirings increases. However, when the capacitance between adjacent wirings increases, the speed at which current travels through the wirings decreases, and the operation of the semiconductor circuit is delayed. In order to optimize all three of the above characteristics of the semiconductor device, the depth at which the nitrogen should be doped into the first oxide film 9 should preferably be 10 nm to 20 nm from the surface. In the above range, the increase of capacitance between adjacent wirings can be restricted to only a 5% increase, the lifetime $T_{50}$ of the wiring to electromigration can be extended by approximately 10%, and the leak current between wirings can be reduced by about 10%.

Also, by forming the area 19b containing nitrogen on the side wall of the via hole 12 in the semiconductor device of the present embodiment, the moisture which is absorbed by the HSQ layer 10 can be prevented from exuding into the via hole 12 when the barrier metal 13 is formed by a sputtering process which immediately follows the wetting process. Also, even if moisture is absorbed by the HSQ layer 10 during the wetting process when the photoresist is peeled away during the creation of the via hole 12, the moisture can be prevented from exuding into the via hole 12 by the area 19b. As a result, not only is the resistance in the via hole 12 increased and the chances that the via hole 12 will not open decreased, but the resistance of the via hole to electromigration is increased.

Figure 6:
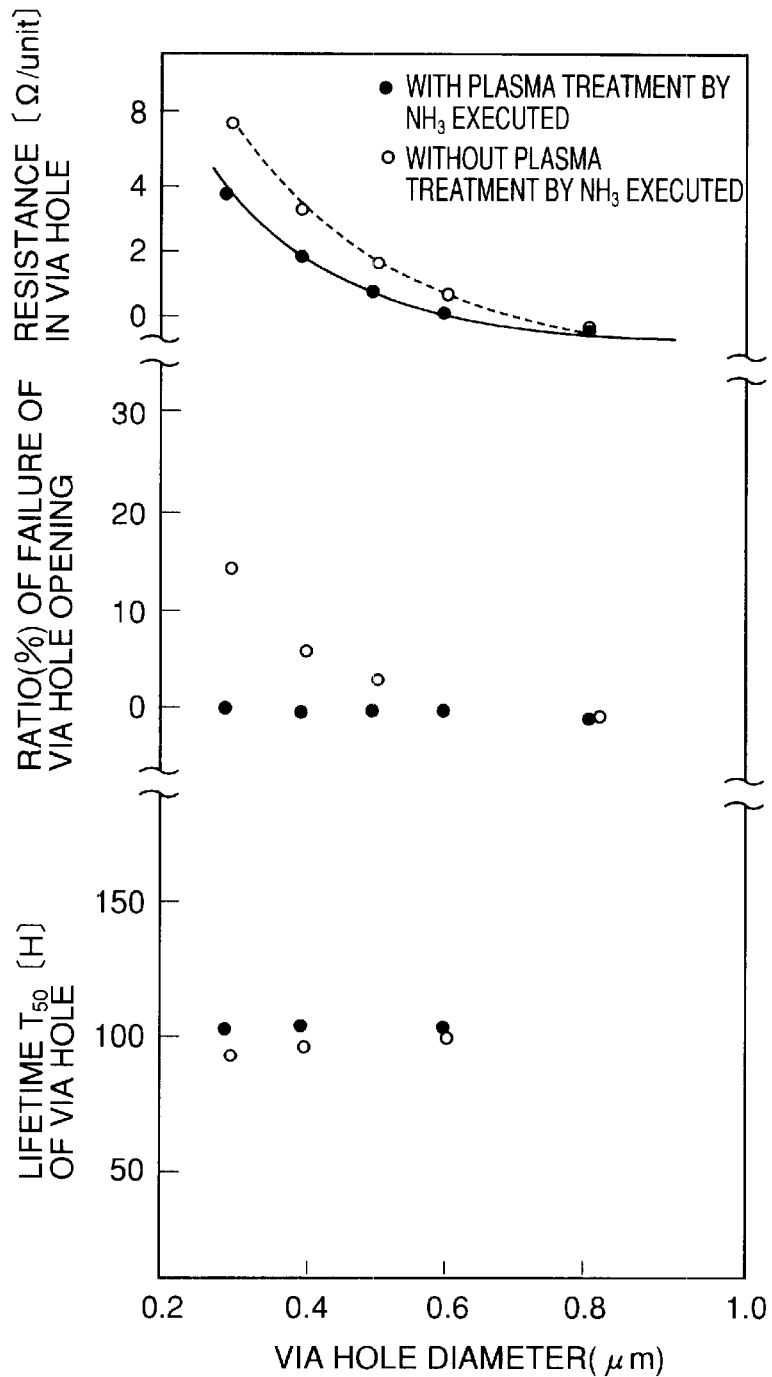
FIG. 6 is a graph comparing the situation in which ammonia plasma treatment is applied to a via hole and a case in which no plasma treatment is applied with respect to the resistance in the via hole, the probability that the via hole will not open, and the resistance to electromigration of the via hole.

The above advantages and characteristics will be described below in conjunction with FIG. 6. FIG. 6 is a graph illustrating various advantages of the semiconductor device of the first embodiment. The graph shows the resistance in the via hole 12 versus the diameter of the via hole 12, the chance that an opening will not be formed in the via hole 12 versus the diameter of the via hole 12, and the lifetime $T_{50}$ to electromigration of the via hole 12 versus the diameter of the via hole 12. Also, the graph shows each of the above relationships for a via hole 12 in which an area 19b containing nitrogen has not been formed and a via hole 12 in which an area 19b of nitrogen has been formed. Also, the lifetime $T_{50}$ of the wirings to electromigration (i.e. the $T_{50}$ at which the resistance of 50% of the wirings increased by 10%) was measured when the current density in the wirings equaled $2 \times 10^6$ A/cm$^2$ and when the temperature was 200° C.

As shown in FIG. 6, if the diameter of a via hole 12 is less than or equal to 0.5 µm and an area 19b is not formed via the plasma treatment, the resistance in the via hole 12 rapidly increases, the chances that an opening will not be formed in the via hole 12 dramatically increases, and the lifetime $T_{50}$ of the via hole 12 to electromigration deteriorates. On the other hand, if the diameter of a via hole 12 is less than or equal to 0.3 µm and the area 19b is formed via the plasma treatment, the resistance in the via hole is relatively small, the chances that an opening will not be formed in the via hole is extremely small, and the lifetime $T_{50}$ to electromigration is approximately 10% higher than the case in which the area 19b is not formed. In the present embodiment, the HSQ layer 10 is used as a film having a low dielectric constant. However, if an organic film having a higher hygroscopicity is used, better effects can be obtained.

Figure 7A:
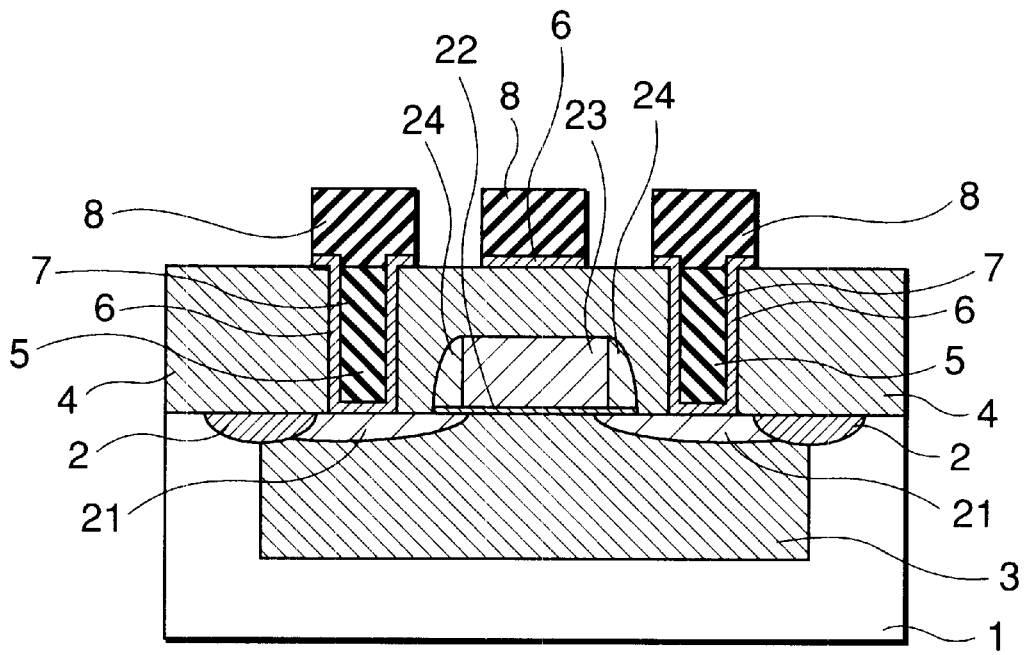
FIGS. 7A and 7B are sectional views of a first set of steps for manufacturing a semiconductor device.

A method of manufacturing a semiconductor device according to a second embodiment will be described in conjunction with FIGS. 7 to 9. FIG. 7A shows the step of forming the semiconductor device from the beginning of the manufacturing process to the formation of first wiring layer 8. Such process is the same as the process described above in conjunction with FIG. 2A.

Figure 7B:
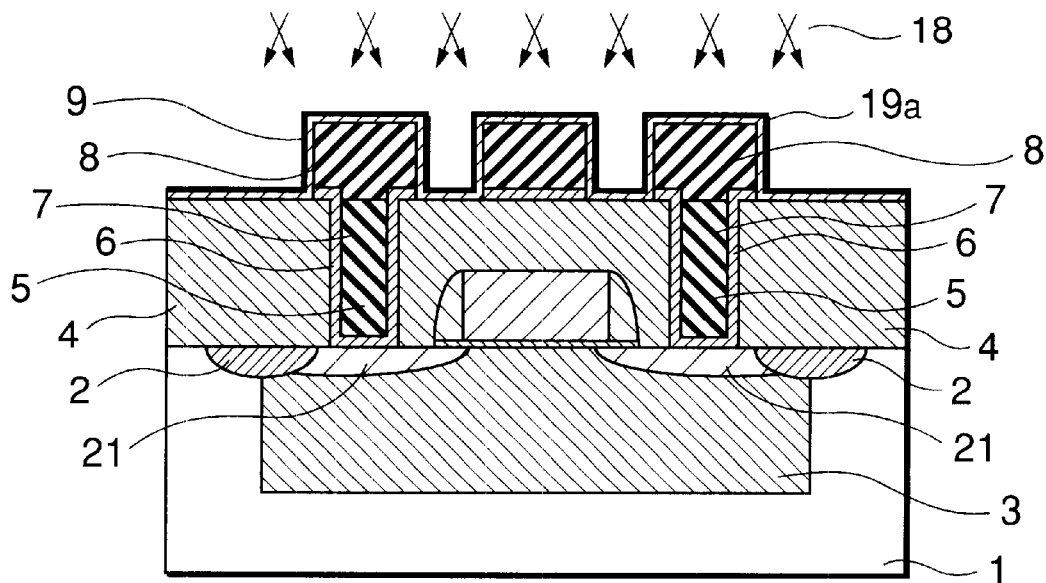

Then, as shown in FIG. 7B, the first oxide film 9 is formed over the first interlayer insulating film 4 and the first wiring layer 8 via a plasma CVD process such that it is approximately 50 nm thick on the upper surface of the first wiring layer 8 and 25 nm thick on the side surfaces of the layer 8. Then, nitrogen is doped into the first oxide film 9 by implanting nitrogenous ions to form an area 19a containing nitrogen. In order to implant the nitrogenous ions, the acceleration energy may be set to 20 keV, the implantation dose may be set to $1 \times 10^{17}$/cm$^2$, and nitrogenous ions may be implanted from at angle of 7° in rotation with the rotation axis. By implanting the ions at such an angle, the amount of ions which are imbedded into the side walls of the first oxide film 9 is increased. In fact, the ions are implanted at a depth which is the similar to the depth of the ions when they are applied via a plasma treatment.

Figure 8A:
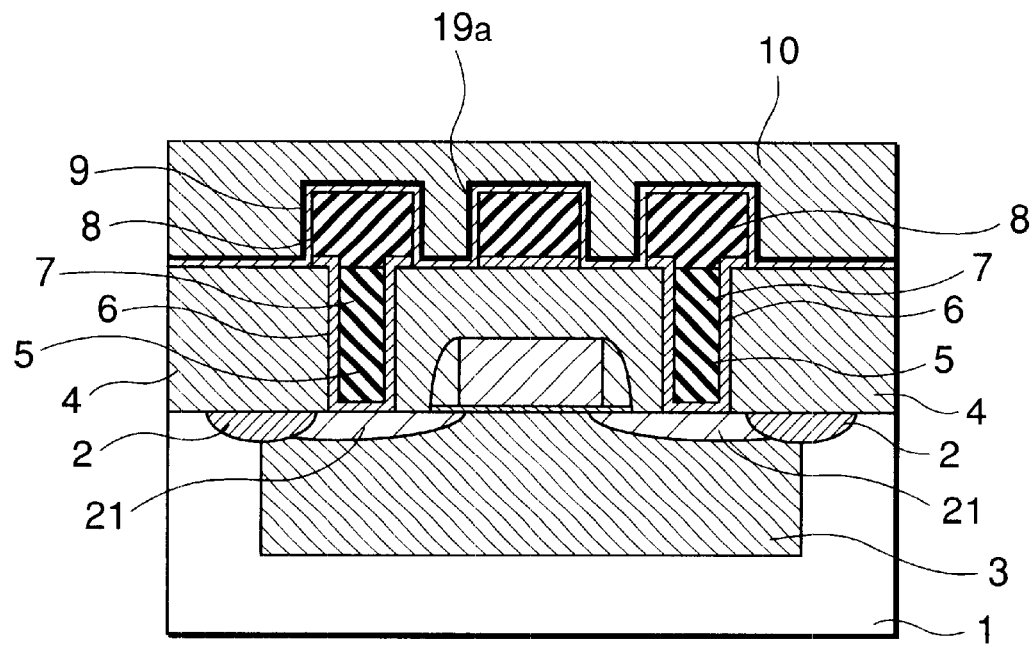
FIGS. 8A and 8B are sectional views of a second set of steps for manufacturing a semiconductor device.

As shown in FIG. 8A, the HSQ layer 10 is formed on the area 19a by a spin coating method so that it is approximately 400 nm thick in the flat part. Afterwards, the HSQ layer 10 is baked at a temperature of approximately 350° C. Then, a heat treatment is applied to the layer 10 at approximately 400° C. to eliminate an organic component such as isomethylbutyl ketone which functions as a solvent.

Figure 8B:
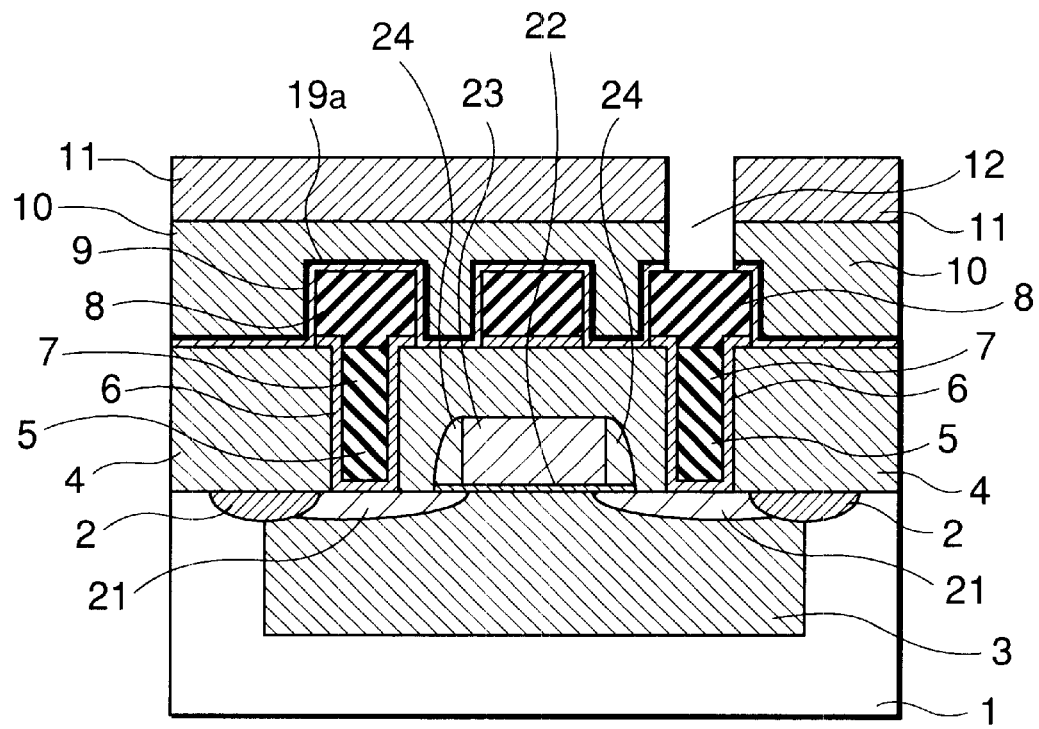

Then, as shown in FIG. 8B, the second oxide film 11 is formed over the HSQ layer 10 and is approximately 2 µm thick. Afterwards, the second oxide film 11 is flattened by a CMP process and/or other processes. A via hole 12 is selectively made through the first oxide film 9, the HSQ layer 10, and the second oxide film 11 and may be made by a photolithographic process followed by a reactive ion etching process. The photoresist (not shown) used to make the via hole 12 is peeled away by an ashing process using oxygen plasma and a wetting process using a mixed solution of $H_2SO_4$ and $H_2O_2$.

Figure 9A:
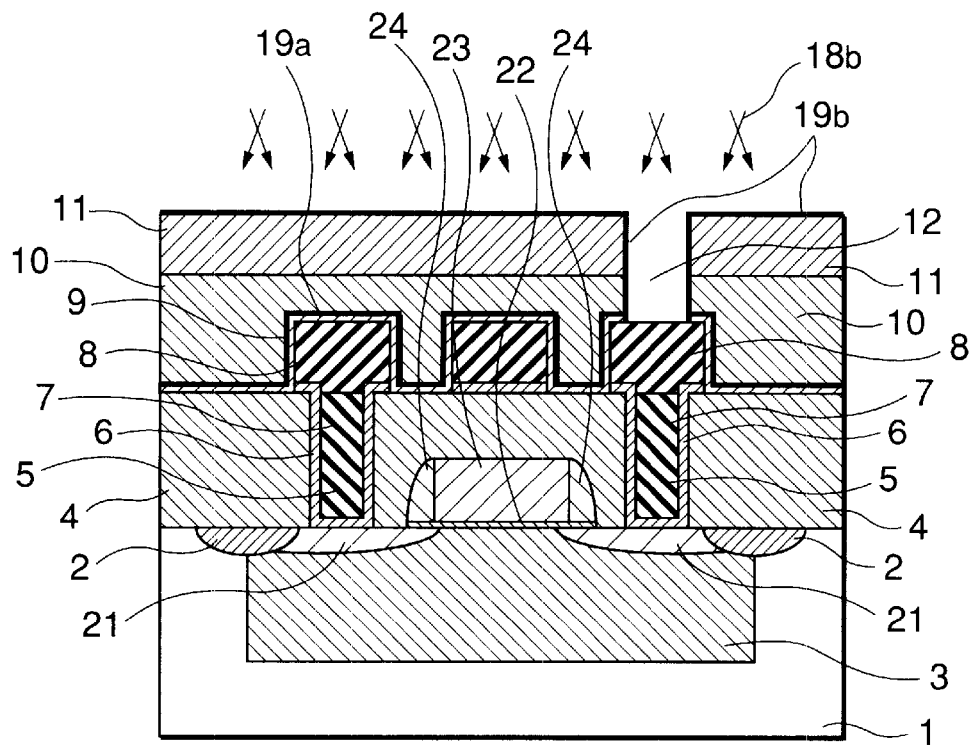
FIGS. 9A and 9B are sectional views of a third set of steps for manufacturing a semiconductor device.

Then, as shown in FIG. 9A, an area 19b containing nitrogen is formed by implanting nitrogenous ions in the second oxide film 11 and in the inner wall of the via hole 12 formed by side surfaces of the second oxide film 11 and the HSQ 10 layer. In order to implant the nitrogenous ions, the acceleration energy may be set to 20 keV, the implantation dose may be set to $1 \times 10^{17}$/cm$^2$, and nitrogenous ions may be implanted from at angle of 7° in rotation with the rotation axis.

Figure 9B:
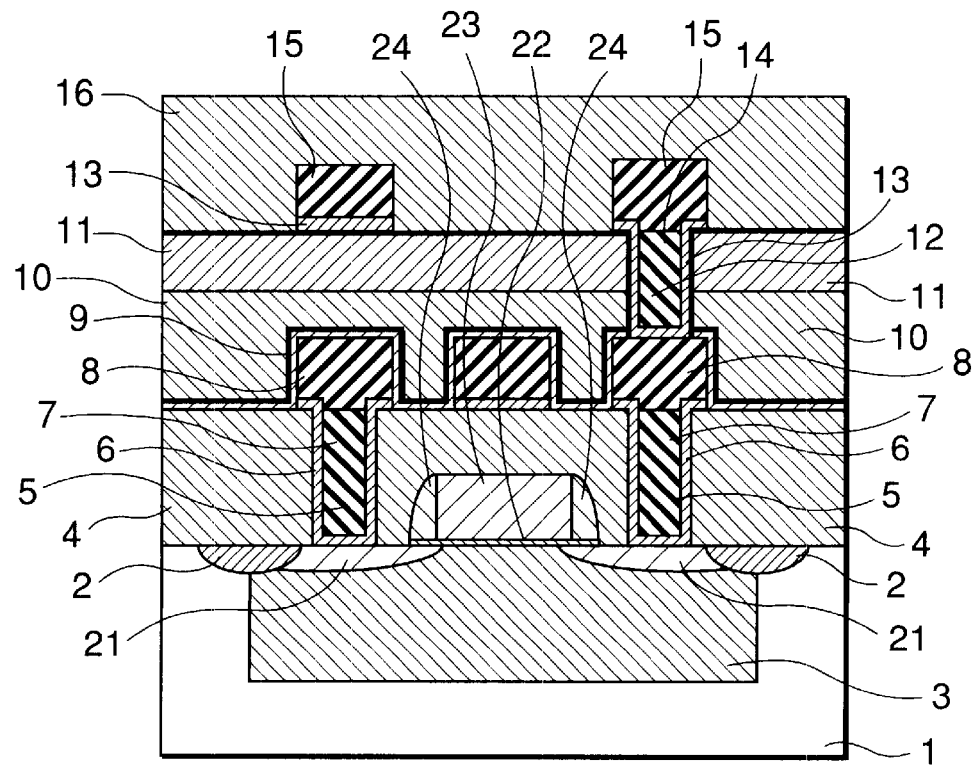
Figure 10:
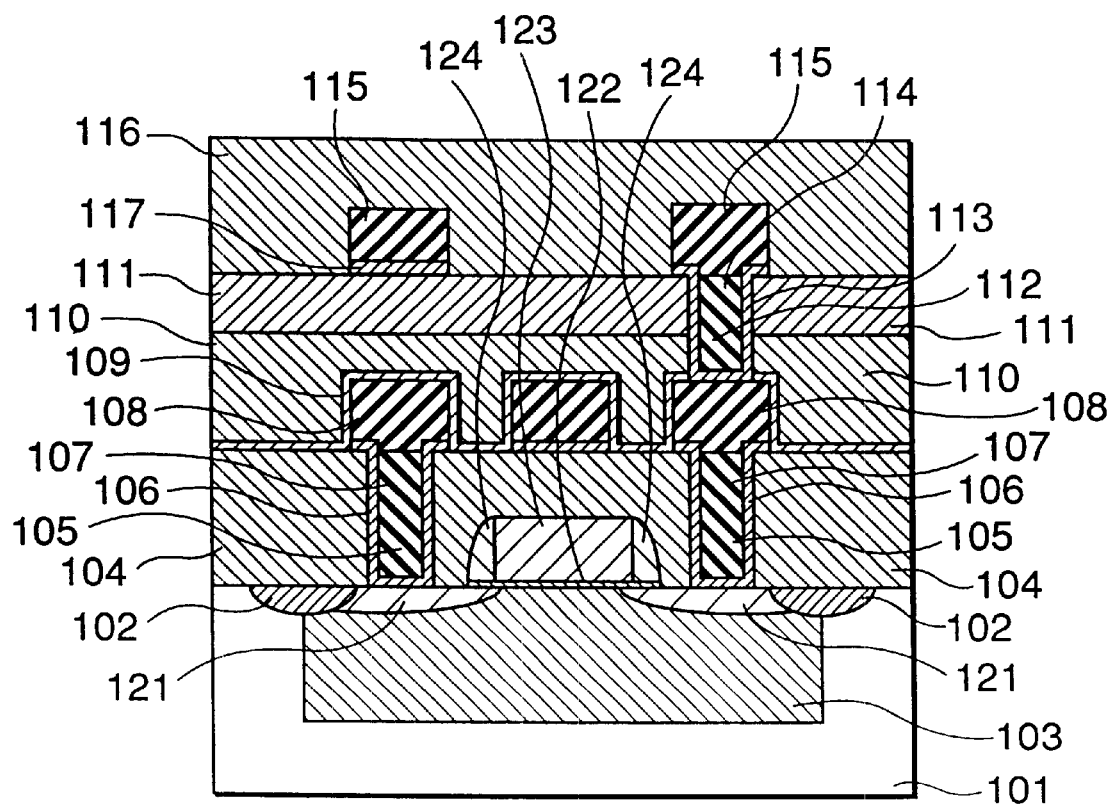
FIG. 10 is a sectional view of a semiconductor device.
Figure 11A:
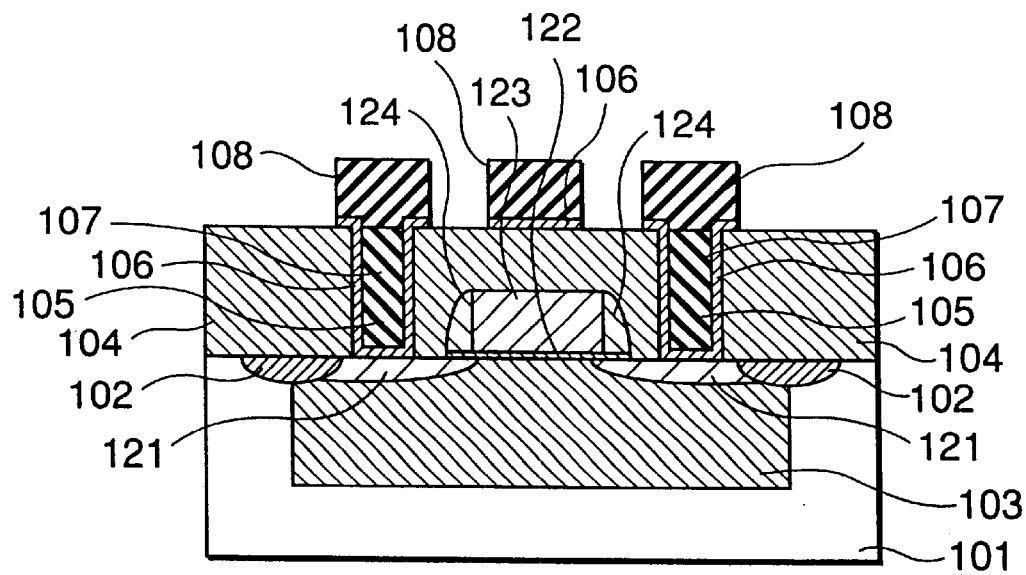
FIGS. 11A and 11B are sectional views of a first set of steps for manufacturing the semiconductor device shown in FIG. 10.
Figure 11B:
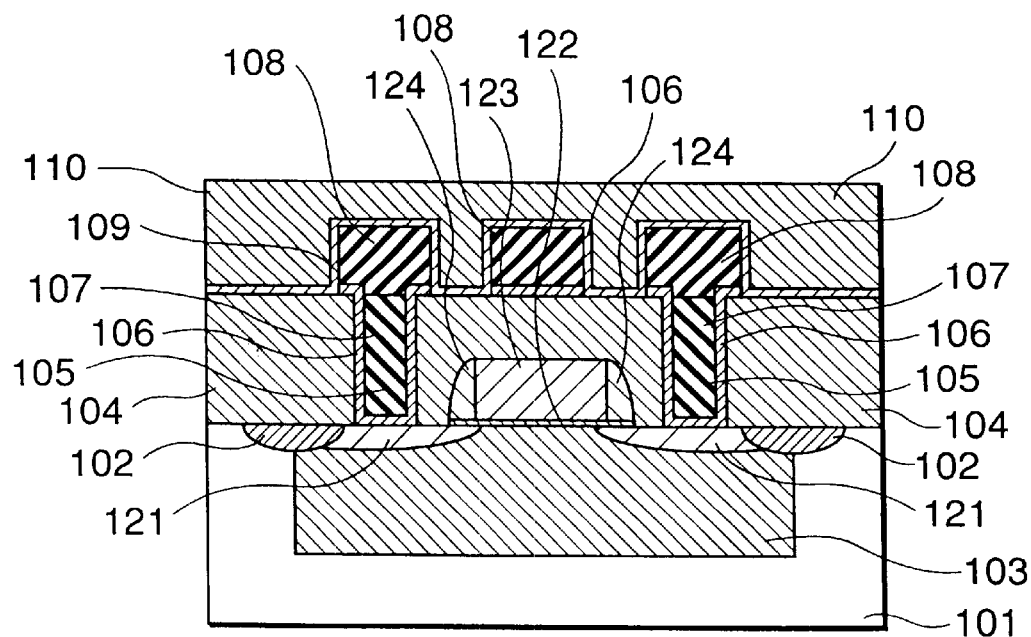
Figure 12:
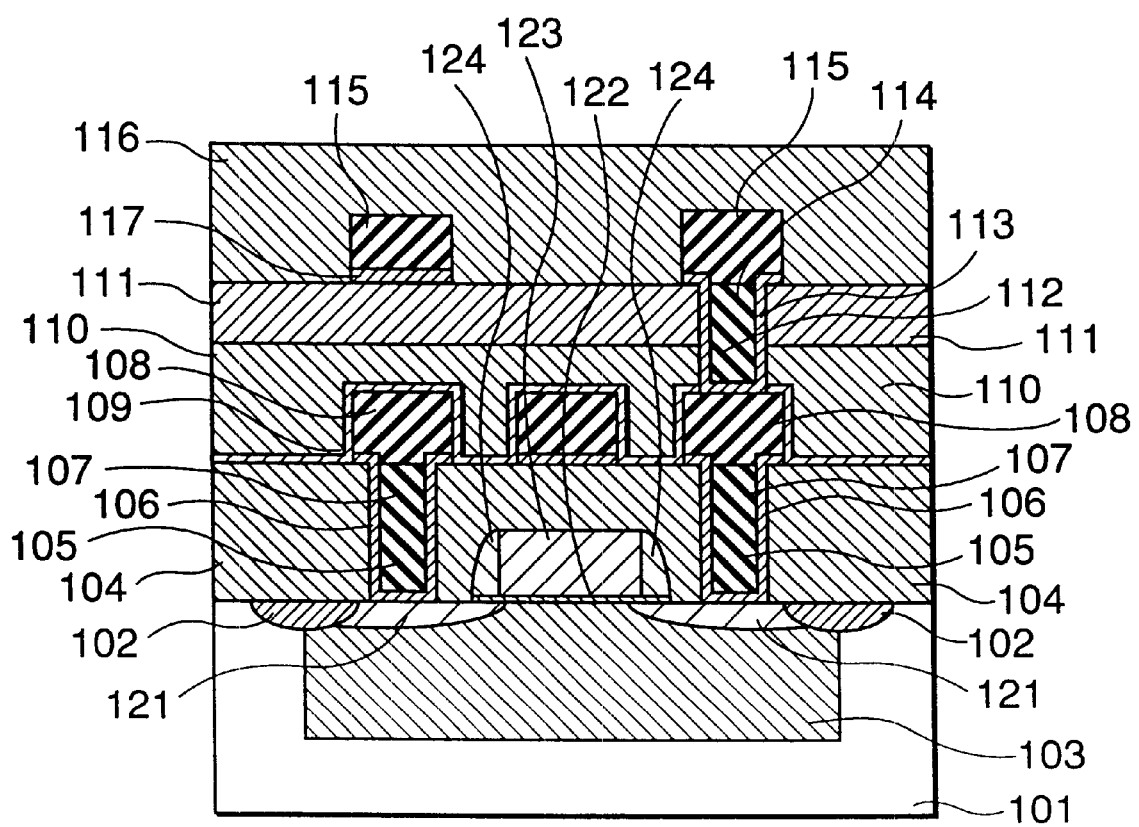
FIG. 12 is a sectional view of a second set of steps for manufacturing the semiconductor device shown in FIG. 10.

As shown in FIG. 9B, the barrier metal 13 containing titanium nitride is formed on silicon oxide film 11 and on the inner surface of the via hole 12. Then, the via hole 12 is filled with tungsten 14 via a blanket CVD process, and an etchback process is performed. Afterwards, an aluminum alloy having a thickness of approximately 0.4 µm is formed over the area 19b and the tungsten 14 in the via hole 12, and the second wiring layer 15 is formed by patterning the aluminum alloy. Then, the semiconductor device is completed by forming the cover film 16 containing plasma SiON on the second wiring layer 15 at a thickness of approximately 1 µm.

In the second embodiment, the method of doping nitrogen into the first oxide film 9 and the side wall of the via hole 12 to form the areas 19a and 19b containing nitrogen is different than the method in the first embodiment because nitrogenous ions are implanted. Also, in the second embodiment, the nitrogenous ions are implanted from a diagonal direction in rotation. Also, the various ranges of densities of nitrogen and depths of doping of the area 19a and 19b in the first embodiment similarly apply to the areas 19a and 19b of the second embodiment.

In the second embodiment, if the peak of the dose of nitrogen is approximately 15 nm deep from the surface on the side wall of the first wiring layer 8 of the first oxide film 9, moisture absorbed by the HSQ layer 10 can be prevented from being diffused to the first wiring layer 8 without increasing capacitance between adjacent wirings. Thus, the reliability of wiring can be enhanced. Also, the leak current between wirings can be reduced.

In the embodiments of the present invention described above, the first oxide film 9 is doped with nitrogen to form an area 19a between the first wiring layer 8 and the HSQ layer 10. Therefore, moisture can be prevented from being diffused to the wirings of the first wiring layer 8 even if the HSQ layer 10 absorbs moisture. As a result, the reliability of the wirings can be improved even when the distance between the wirings is reduced, and the leak current between the wirings can be reduced even if the space between the wirings is reduced.

Also, an area 19b containing nitrogen is formed on the side wall of the via hole 12, and thus, the leak current between adjacent via holes 12 can be reduced. Furthermore, the nitrogen is doped into the side wall of a via hole 12 after the wetting process is performed to peel away a photoresist which is used to form the via hole 12. Thus, the resistance in the via hole is increased, the chances that an opening will not occur in the via hole 12 is reduced, and the deterioration of the resistance of the via hole 12 to electromigration can be prevented because the moisture is prevented from exuding into the via hole 12 when the barrier metal 13 is subsequently sputtered. Also, moisture is prevented from exuding into the via hole 12 during a subsequent heating process even if the moisture is absorbed by the HSQ layer 10 from the side wall of the via hole 12 when the photoresist is peeled away during the wetting process.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed is:

1. A semiconductor device, comprising:
   a substrate;
   a first wiring layer;
   a first oxide film, wherein said first wiring layer is disposed between said first oxide film and said substrate;
   a dielectric film having a low dielectric constant, wherein said first oxide film is disposed between said dielectric film and said first wiring layer; and
   a first layer containing nitrogen, wherein said first layer is formed between said first oxide film and said dielectric film,
   wherein said first layer is formed by supplying a layer of said first oxide film with nitrogen ions, and
   wherein a first nitrogen density of said nitrogen ions from a surface of said first layer to a first depth of 10 nm is greater than or equal to $1 \times 10^{21}/cm^3$.

2. A semiconductor device, comprising:
   a substrate;
   a first wiring layer;
   a first oxide film, wherein said first wiring layer is disposed between said first oxide film and said substrate;
   a dielectric film having a low dielectric constant, wherein said first oxide film is disposed between said dielectric film and said first wiring layer; and
   a first layer containing nitrogen, wherein said first layer is formed between said first oxide film and said dielectric film,
   wherein said first layer is formed by supplying a layer of said first oxide film with nitrogen ions, and
   wherein a first nitrogen density of said nitrogen ions from a surface of said first layer to a first depth of 20 nm is greater than or equal to $1 \times 10^{21}/cm^3$.

3. A semiconductor device, comprising:
   a substrate;
   a first wiring layer;
   a first oxide film, wherein said first wiring layer is disposed between said first oxide film and said substrate;
   a dielectric film having a low dielectric constant, wherein said first oxide film is disposed between said dielectric film and said first wiring layer; and
   a first layer containing nitrogen, wherein said first layer is formed between said first oxide film and said dielectric film,
   wherein said first oxide film is formed on said first wiring layer and said dielectric film is formed on said first layer,
   wherein said first layer is formed by supplying a layer of said first oxide film with nitrogen ions, and
   wherein a first nitrogen density of said nitrogen ions from a surface of said first layer to a first depth of 10 nm is than or equal to $1 \times 10^{21}/cm^3$.

4. A semiconductor device, comprising:
   a substrate;
   a first wiring layer;
   a first oxide film, wherein said first wiring layer is disposed between said first oxide film and said substrate;
   a dielectric film having a low dielectric constant, wherein said first oxide film is disposed between said dielectric film and said first wiring layer; and
   a first layer containing nitrogen, wherein said first layer is formed between said first oxide film and said dielectric film,
   wherein said first oxide film is formed on said first wiring layer and said dielectric film is formed on said first layer,
   wherein said first layer is formed by supplying a layer of said first oxide film with nitrogen ions, and
   wherein a first nitrogen density of said nitrogen ions from a surface of said first layer to a first depth of 20 nm is than or equal to $1 \times 10^{21}/cm^3$.

5. The semiconductor device as claimed in claim 1, wherein said dielectric constant of said dielectric film is less than or equal to 3.5.

6. The semiconductor device as claimed in claim 3, wherein said dielectric constant of said dielectric film is less than or equal to 3.5.

7. A semiconductor device having a plurality wiring layers, comprising:
   a first wiring layer;
   a second wiring layer;
   a dielectric film having a low dielectric constant disposed between said first wiring layer and said second wiring layer;
   a via hole formed through said dielectric film and disposed between said first wiring layer and said second wiring layer for electrically connecting said first wiring layer and said second wiring layer; and a first layer containing nitrogen formed on a side wall of said via hole, wherein said first layer is formed by supplying said side wall of said via hole with nitrogen ions, wherein said first layer is formed by doping said side wall of said via hole with $NH_3$ plasma, and wherein a first nitrogen density of said nitrogen ions from a surface of said first layer to a first depth of 10 nm is greater than or equal to $1\times10^{21}/cm^3$.

8. A semiconductor device having a plurality wiring layers, comprising:

a first wiring layer;

a second wiring layer;

a dielectric film having a low dielectric constant disposed between said first wiring layer and said second wiring layer;

a via hole formed through said dielectric film and disposed between said first wiring layer and said second wiring layer for electrically connecting said first wiring layer and said second wiring layer; and a first layer containing nitrogen formed on a side wall of said via hole, wherein said first layer is formed by supplying said side wall of said via hole with nitrogen ions, wherein said first layer is formed by doping said side wall of said via hole with $NH_3$ plasma, and wherein a first nitrogen density of said nitrogen ions from said surface of said first layer to a first depth of 20 nm is greater than or equal to $1\times10^{21}/cm^3$.

9. A semiconductor device having a plurality wiring layers, comprising:

a first wiring layer;

a second wiring layer;

a dielectric film having a low dielectric constant disposed between said first wiring layer and said second wiring layer;

a via hole formed through said dielectric film and disposed between said first wiring layer and said second wiring layer for electrically connecting said first wiring layer and said second wiring layer; and a first layer containing nitrogen formed on a side wall of said via hole, wherein said first layer is formed by supplying said side wall of said via hole with nitrogen ions, wherein said first layer is formed by implanting nitrogenous ions into said side wall of said via hole, and wherein a first nitrogen density of said nitrogen ions from a surface of said first layer to a first depth of 10 nm is greater than or equal to $1\times10^{21}/cm^3$.

10. A semiconductor device having a plurality wiring layers, comprising:

a first wiring layer;

a second wiring layer;

a dielectric film having a low dielectric constant disposed between said first wiring layer and said second wiring layer;

a via hole formed through said dielectric film and disposed between said first wiring layer and said second wiring layer for electrically connecting said first wiring layer and said second wiring layer; and a first layer containing nitrogen formed on a side wall of said via hole, wherein said first layer is formed by supplying said side wall of said via hole with nitrogen ions, wherein said first layer is formed by implanting nitrogenous ions into said side wall of said via hole, and wherein a first nitrogen density of said nitrogen ions from said surface of said first layer to a first depth of 20 nm is greater than or equal to $1\times10^{21}/cm^3$.

11. A semiconductor device, comprising:

a substrate;

a first wiring layer;

a first oxide film, wherein said first wiring layer is disposed between said first oxide film and said substrate;

a dielectric film having a low dielectric constant, wherein said first oxide film is disposed between said dielectric film and said first wiring layer;

a first layer containing nitrogen, wherein said first layer is formed between said first oxide film and said dielectric film;

a second wiring layer, wherein said dielectric film is disposed between said second wiring layer and said first wiring layer;

a via hole formed through said dielectric film and disposed between said first wiring layer and said second wiring layer for electrically connecting said first wiring layer and said second wiring layer; and a second layer containing nitrogen formed on a side wall of said via hole, wherein said second layer is-formed by supplying said side wall of said via hole with nitrogen ions, wherein said second layer is formed by doping said side wall of said via hole with $NH_3$ plasma, and wherein a nitrogen density of said nitrogen ions from a surface of said second layer to a depth of 10nm is greater than or equal to $1\times10^{21}/cm^3$.

12. A semiconductor device, comprising:

a substrate;

a first wiring layer; CD a first oxide film, wherein said first wiring layer is disposed between said first oxide film and said substrate;

a dielectric film having a low dielectric constant, wherein said first oxide film is disposed between said dielectric film and said first wiring layer;

a first layer containing nitrogen, wherein said first layer is formed between said first oxide film and said dielectric film;

a second wiring layer, wherein said dielectric film is disposed between said second wiring layer and said first wiring layer;

a via hole formed through said dielectric film and disposed between said first wiring layer and said second wiring layer for electrically connecting said first wiring layer and said second wiring layer; and a second layer containing nitrogen formed on a side wall of said via hole, wherein said second layer is formed by supplying said side wall of said via hole with nitrogen ions, wherein said second layer is formed by doping said side wall of said via hole with $NH_3$ plasma, and wherein a nitrogen density of said nitrogen ions from a surface of said second layer to a depth of 20 nm is greater than or equal to $1\times10^{21}/cm^3$.

13. A semiconductor device, comprising:

a substrate;

a first wiring layer formed at least indirectly on said substrate;

a first oxide film formed on said first wiring layer;

a dielectric film having a low dielectric constant formed on said first oxide film;

a first layer containing nitrogen formed in said first oxide film;

a second wiring layer, wherein said dielectric film is disposed between said second wiring layer and said first wiring layer;

a via hole formed through said dielectric film and disposed between said first wiring layer and said second wiring layer for electrically connecting said first wiring layer and said second wiring layer; and a second layer containing nitrogen formed in a side wall of said via hole, wherein said first layer is formed by doping said first oxide film with $NH_3$ plasma, wherein said second layer is formed by doping said side wall of said via hole with $NH_3$ plasma, wherein a first nitrogen density of said nitrogen from a surface of said first layer to a first depth of 10 nm is greater than or equal to $1 \times 10^{21}/cm^3$, and wherein a second nitrogen density of said nitrogen from a surface of said second layer to a second depth of 10 nm is greater than or equal to $1 \times 10^{21}/cm^3$.

14. A semiconductor device, comprising:

a substrate;

a first wiring layer formed at least indirectly on said substrate;

a first oxide film formed on said first wiring layer;

a dielectric film having a low dielectric constant formed on said first oxide film; a first layer containing nitrogen formed in said first oxide film;

a second wiring layer, wherein said dielectric film is disposed between said second wiring layer and said first wiring layer;

a via hole formed through said dielectric film and disposed between said first wiring layer and said second wiring layer for electrically connecting said first wiring layer and said second wiring layer; and a second layer containing nitrogen formed in a side wall of said via hole, wherein said first layer is formed by doping said first oxide film with $NH_3$ plasma, wherein said second layer is formed by doping said side wall of said via hole with $NH_3$ plasma, wherein a first nitrogen density of said nitrogen from a surface of said first layer to a first depth of 20 nm is greater than or equal to $1 \times 10^{21}/cm^3$, and wherein a second nitrogen density of said nitrogen from a surface of said second layer to a second depth of 20 nm is greater than or equal to $1 \times 10^{21}/cm^3$.

* * * * *

UNITED STATES PATENT AND TRADEMARK OFFICE
CERTIFICATE OF CORRECTION

PATENT NO. : 6,633,082 B1
DATED : October 14, 2003
INVENTOR(S) : Noriaki Oda and Akira Matsumoto It is certified that error appears in the above-identified patent and that said Letters Patent is hereby corrected as shown below:

<u>Title page,</u>
Item [54], Title, delete "SEMICONDUCTOR DEVICE AND METHOD FOR MANUFACTURING THE SEMICONDUCTOR DEVICE" insert -- SEMICONDUCTOR DEVICE WITH MULTILAYER WIRING AND LOW DIELECTRIC CONSTANT INTERLAYER INSULATING FILM --

Signed and Sealed this

Eleventh Day of May, 2004

JON W. DUDAS
*Acting Director of the United States Patent and Trademark Office*